(12) United States Patent
Huang et al.

(10) Patent No.: US 7,183,171 B2
(45) Date of Patent: Feb. 27, 2007

(54) PYRAMID-SHAPED CAPACITOR STRUCTURE

(75) Inventors: Kun-Ming Huang, Taipei (TW); YJ Wang, Hsin-Chu (TW); Ying-De Chen, Fangliao Township (TW); Eugene Chu, Hsinchu (TW); Fu-Hsin Chen, Jhudong Township (TW); Tzu-Yang Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/252,328

(22) Filed: Oct. 17, 2005

(65) Prior Publication Data

US 2006/0197091 A1    Sep. 7, 2006

Related U.S. Application Data

(63) Continuation-in-part of application No. 11/074,523, filed on Mar. 7, 2005, now Pat. No. 7,109,090.

(51) Int. Cl.
*H01L 21/8242* (2006.01)
(52) U.S. Cl. ............ 438/396; 438/253; 438/254; 438/397; 438/695; 257/296; 257/306; 257/532; 257/E27.048
(58) Field of Classification Search ......... 438/239, 438/250, 253, 393, 396, FOR. 220, FOR. 430, 438/695; 257/296, 298, 306, 311, 532, E27.034, 257/E27.048, E27.071
See application file for complete search history.

(56) References Cited

U.S. PATENT DOCUMENTS

| | | | |
|---|---|---|---|
| 4,466,177 A * | 8/1984 | Chao | ............ 438/251 |
| 4,914,497 A * | 4/1990 | Kondo | ............ 257/296 |
| 5,903,023 A | 5/1999 | Hoshi | |
| 6,207,499 B1 | 3/2001 | Hoshi | |
| 6,462,370 B2 | 10/2002 | Kuwazawa | |
| 6,579,764 B2 | 6/2003 | Kuwazawa | |
| 6,858,513 B2 | 2/2005 | Fujisawa | |
| 2002/0022335 A1 | 2/2002 | Chen | |
| 2003/0006442 A1 | 1/2003 | Fujisawa | |
| 2003/0127675 A1 | 7/2003 | Fujisawa | |
| 2005/0082586 A1 | 4/2005 | Tu et al. | |

* cited by examiner

*Primary Examiner*—George R. Fourson
*Assistant Examiner*—Joannie Adelle García
(74) *Attorney, Agent, or Firm*—Slater & Matsil, L.L.P.

(57) ABSTRACT

A capacitor structure which has generally pyramidal or stepped profile to prevent or reduce dielectric layer breakdown is disclosed. The capacitor structure includes a first conductive layer, at least one dielectric layer having a first area provided on the first conductive layer and a second conductive layer provided on the at least one dielectric layer. The second conductive layer has a second area which is less than the first area of the at least one dielectric layer. A method of fabricating a capacitor structure is also disclosed.

14 Claims, 6 Drawing Sheets

PYRAMID-SHAPED CAPACITOR STRUCTURE

This application is a continuation-in-part of U.S. patent application Ser. No. 11/074,523, filed on Mar. 7, 2005, now U.S. Pat. No. 7,109,090 which application is incorporated herein by reference.

TECHNICAL FIELD

The present invention relates to semiconductor devices, and more particularly, to a generally pyramid-shaped capacitor structure in a semiconductor device that is characterized by reduced vulnerability to edge breakdown and a method for manufacturing such a device.

BACKGROUND

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically-conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

There is currently a drive in the semiconductor device industry to produce semiconductors having an increasingly large density of integrated circuits, which are at the same time ever-decreasing in size. These goals are achieved by scaling down the size of the circuit features in both the lateral and vertical dimensions. Vertical downscaling requires that the thickness of gate oxides on the wafer be reduced by a degree which corresponds to shrinkage of the circuit features in the lateral dimension. While there are still circumstances in which thicker gate dielectrics on a wafer are useful, such as to maintain operating voltage compatibility between the device circuits manufactured on a wafer and the current packaged integrated circuits which operate at a standard voltage, ultrathin gate dielectrics are becoming increasingly essential for the fabrication of semiconductor integrated circuits in the burgeoning small/fast device technology.

The ongoing advances in the field of fabricating miniaturized electronic integrated circuits (ICs) has involved the fabrication of multiple layers of interconnects, or the layers of separate electrical conductors which are formed on top of a substrate and connect various functional components of the substrate and other electrical connections to the IC. Electrical connections between the interconnect layers and the functional components on the substrate are achieved by via interconnects, which are post or plug-like vertical connections between the conductors of the interconnect layers and the substrate. ICs often have five or more interconnect layers formed on top of the substrate.

Capacitors are one of the most common passive elements used in very large-scale integrated (VLSI) circuits. Capacitors are often integrated into active elements such as bipolar transistors or complementary metal oxide semiconductors (CMOS) transistors. Capacitors in semiconductor devices may have one of various forms, including polysilicon-insulator-polysilicon (PIP), metal-insulator-silicon (MIS), metal-insulator-metal (MIM) and metal-insulator-polysilicon (MIP).

Figure 1:
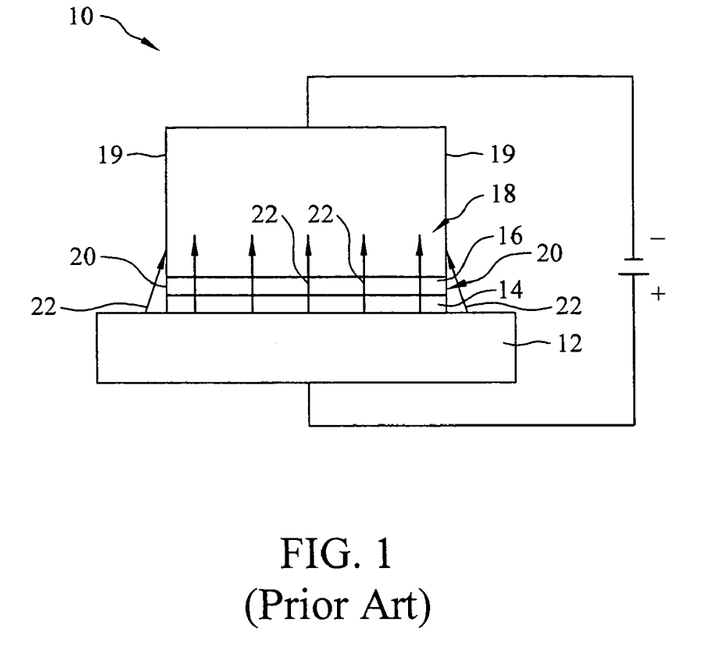
FIG. 1 is a cross-sectional view illustrating a conventional metal-insulator-polysilicon (MIP) capacitor structure.

A conventional MIP capacitor structure 10 is shown in FIG. 1. The MIP capacitor structure 10 includes a polysilicon layer 12, a first dielectric layer 14 provided on the polysilicon layer 12, a second dielectric layer 16 provided on the first dielectric layer 14 and a metal layer 18 provided on the second dielectric layer 16. As shown in FIG. 1, the area of the dielectric layers 14 and 16 is the same as the area of the metal layer 18. Thus, the edges 20 of the dielectric layers 14 and 16 are flush with the edges 19 of the metal layer 18. As alluded to above, metal layer 18 will for convenience be referred to as being at the top of capacitor structure 10, and polysilicon layer 12 at the bottom, even though the device itself may be used in almost any orientation. With this in mind, the terms 'pyramidal' or 'pyramid-shaped' refer to a structure that is smaller in area at the top than at the bottom.

The capacitance (C) of the MIP capacitor structure 10 is a function of the dielectric film area (A) and the dielectric film thickness (d), according to the equation: $C = \in A/d$, where $\in$ is the dielectric constant of the material used. The electrical charge (Q) established across the structure 10 is related to the capacitance (C) and voltage (V) differential according to the equation Q=CV. Therefore, increasing the area or decreasing the thickness of the dielectric layers 14 and 16 correspondingly increases the capacitance, and thus, the charge established across the dielectric layers 14 and 16 of the capacitor structure 10.

During application of an electrical charge (Q) across the first dielectric layer 14 and the second dielectric layer 16, the strength of the electric field 22 at the dielectric layer edges 20 and at the center region of the dielectric layers 14 and 16 is non-uniform. This results in breakdown of the dielectric layers 14 and 16 at the dielectric layer edges 20, causing electrical shorting of the capacitor structure 10. In MIP capacitor structures, the roughness of the polysilicon surface further contributes to breakdown of the dielectric layer or layers.

It is believed that optimizing the profile of a capacitor structure in such a manner that the area of the dielectric layer or layers is larger than the area of the metal or polysilicon layer facilitates formation of an electric field which is substantially uniform across all regions of the dielectric layer or layers. This prevents or substantially reduces breakdown of the dielectric layer edges of the capacitor structure.

Accordingly, an object of the present invention is to provide a novel pyramid-shaped structure for a capacitor.

Another object of the present invention is to provide a novel capacitor structure which has a generally stepped profile to prevent or substantially reduce breakdown of the edges of a dielectric layer or layers.

Still another object of the present invention is to provide a novel capacitor structure which is applicable to a MIP or a PIP capacitor structure.

Yet another object of the present invention is to provide an improved pyramidal-profile capacitor structure in which an electrically-insulating dielectric layer sandwiched between a conductive layer (of metal, for example) and a polysilicon layer has an area that is larger than the area of the conductive layer, wherein the dielectric layer itself has a smaller area at the top than at the bottom.

A still further object of the present invention is to provide a novel method of fabricating a capacitor structure having a generally pyramidal profile to prevent or substantially reduce the incidence of dielectric layer breakdown at the edges of a dielectric layer or layers sandwiched between a polysilicon layer and a metal layer or between two polysilicon layers.

SUMMARY OF THE INVENTION

In accordance with these and other objects and advantages, the present invention is generally directed to a novel pyramid-shaped capacitor structure for integrated circuit (IC) devices. In one embodiment, the pyramid-shaped metal-insulator-polysilicon (MIP) capacitor structure has a generally pyramidal profile and includes a polysilicon layer on which is provided at least one dielectric layer. A metal layer is provided on the at least one dielectric layer and has an area which is less than the area of the dielectric layer. In another embodiment, the pyramid-shaped polysilicon-insulator-polysilicon (PIP) capacitor structure includes a first polysilicon layer on which is provided at least one dielectric layer and a second polysilicon layer provided on the at least one dielectric layer. The second polysilicon layer has an area which is less than an area of the at least one dielectric layer. In either embodiment, the at least one dielectric layer may be shaped so that it has a smaller area at the top than it does at the bottom to further optimize the capacitor. In these embodiments, the edges of the at least one dielectric layer are characterized by enhanced resistance to physical breakdown upon the establishment of an electrical field across the dielectric layer or layers.

The present invention is further directed to a method of fabricating a pyramid-shaped capacitor structure which is resistant to dielectric edge breakdown. The method includes providing a polysilicon layer, providing at least one dielectric layer on the polysilicon layer, providing a metal layer or second polysilicon layer on the at least one dielectric layer, providing a photoresist layer on the metal or polysilicon layer, dry-etching the metal or polysilicon layer, descumming and wet rinsing to remove stray artifacts, wet-etching the metal or polysilicon layer to render the area of the metal or polysilicon layer less than the area of the at least one dielectric layer, and stripping the photoresist layer from the metal or polysilicon layer.

BRIEF DESCRIPTION OF THE DRAWINGS

The invention will now be described, by way of example, with reference to the accompanying drawings, in which.

DETAILED DESCRIPTION OF ILLUSTRATIVE EMBODIMENTS

The present invention contemplates a capacitor structure which has a generally pyramidal profile. The capacitor structure includes a bottom conductive layer, a top conductive layer and at least one dielectric layer interposed between the bottom and top conductive layers. The at least one dielectric layer has a surface area which is greater than the surface area of the top conductive layer. The transition from larger to smaller area may be stepped or gradual, or both types may be used in a single device. This imparts a pyramid-shaped profile to the capacitor structure and facilitates establishment of a uniform electric field across the at least one dielectric layer of the capacitor, preventing or reducing breakdown of the dielectric layer edges throughout the lifetime of the capacitor structure.

The terms "top" and "bottom" will for convenience be used herein to describe the relationship of various components (or layers) with respect to each other in the capacitor structure, as they are oriented in the drawing. It is understood that components described in such a manner need not necessarily be positioned in vertically-spaced relationship with respect to each other in a semiconductor device but may be otherwise positioned with respect to each other in a manner which is consistent with the functional requirements of the capacitor structure in a semiconductor device.

The "area" of a component part of the capacitor refers to its area at a given level as viewed from the top or bottom, as those terms are explained above. The area will be considered to be on a plane that is substantially parallel to the wafer surface unless otherwise stated. The area of a component part (for example, a dielectric layer) need not, of course, be uniform from the top of the component to the bottom of the component. The transition region of a component refers to the portion of that component where the area is in fact changing as the plane on which the area is taken is moved from top to bottom. In some instances a transition region will include two or more components.

Figure 2:
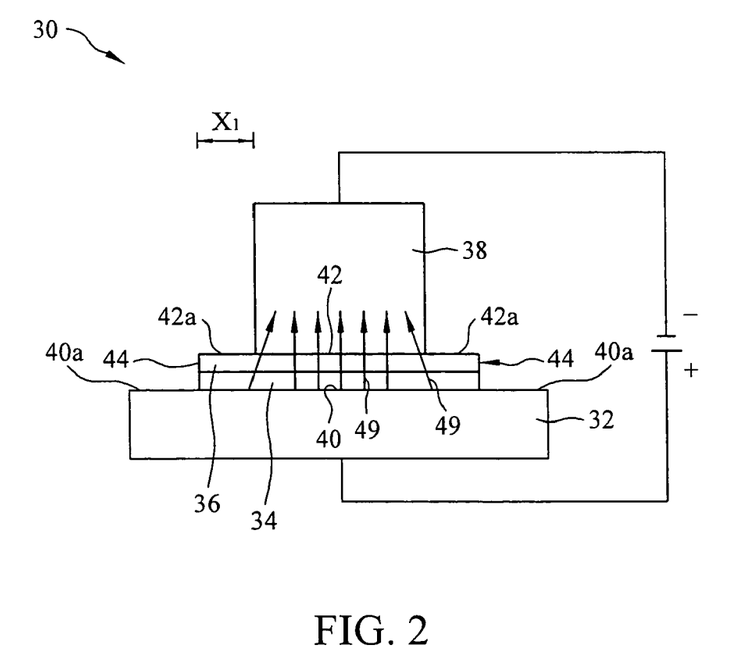
FIG. 2 is a cross-sectional view illustrating a pyramid-shaped capacitor structure according to the invention of U.S. patent application Ser. No. 11/074,523, referred to above.
Figure 3:
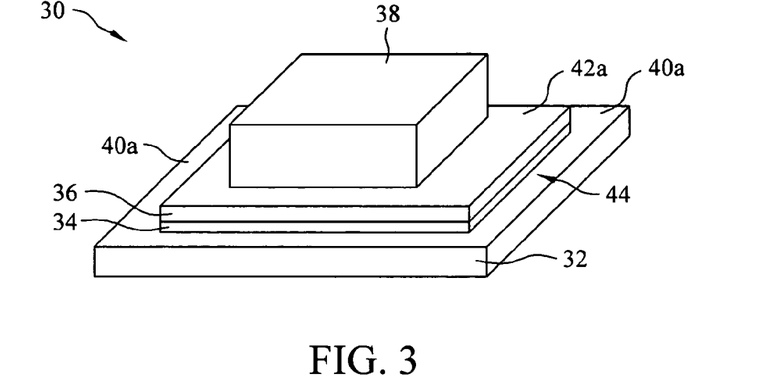
FIG. 3 is a perspective view of the pyramid-shaped capacitor structure shown in FIG. 2.

Referring to FIGS. 2 and 3, an illustrative pyramid-shaped capacitor structure according to the invention of U.S. patent application Ser. No. 11/074,523, referred to above is generally indicated by reference numeral 30. The capacitor structure 30 includes a bottom conductive layer 32 which is typically polysilicon. At least one dielectric layer is provided on the upper surface 40 of the bottom conductive layer 32. In this embodiment of the capacitor structure 30 shown in FIGS. 2 and 3, a bottom dielectric layer 34 is provided on the upper surface 40 of the bottom conductive layer 32, and a top dielectric layer 36 is provided on the bottom dielectric layer 34. The bottom dielectric layer 34 may be silicon oxide, for example, and has a thickness of typically about 100 to 800 angstroms. The top dielectric layer 36 may be silicon nitride, for example, and has a thickness of typically about 100 to 800 angstroms. Note that the drawings are not intended to be "to scale" and the relative sizes of each component part may vary unless recited otherwise.

A top conductive layer 38 is provided on the upper surface 42 of the top dielectric layer 36. The capacitor structure 30 may be a metal-insulator-polysilicon (MIP) capacitor structure, for example, in which case the top conductive layer 38 is a metal such as copper, for example. Alternatively, the capacitor structure 30 may be a polysilicon-insulator-polysilicon (PIP) capacitor structure, for example, in which case the top conductive layer 38 is polysilicon.

The upper surface 40 of the bottom conductive layer 32 has an area which is larger than the area of each of the bottom dielectric layer 34 and the top dielectric layer 36 (which, in this illustration, are the same). Therefore, the upper surface 40 of the bottom conductive layer 32 includes an exposed surface 40a which extends from the periphery of the bottom dielectric layer 34 and top dielectric layer 36, as shown in FIG. 3. Similarly, the upper surface 42 of the top dielectric layer 36 has an area which is larger than the area of the top conductive layer 38. Therefore, the upper surface 42 of the top dielectric layer 36 includes an exposed surface 42a which extends from the periphery of the bottom periphery of the top conductive layer 38. As shown in FIG. 2, the exposed surface 42a of the top dielectric layer 36 has a width $X_1$ of typically at least about 0.1 µm (1000 angstroms).

As shown in FIG. 2, during application of an electrical charge to the bottom conductive layer 32 and top conductive layer 38 to form a voltage potential across the bottom dielectric layer 34 and top dielectric layer 36, an electrical field 49 is established. Due to the exposed surface 42a on the top dielectric layer 36, the magnitude of the electric field 49 is substantially the same throughout all regions of the bottom dielectric layer 34 and the top dielectric layer 36. This prevents or substantially reduces breakdown of the dielectric edges 44 of the bottom dielectric layer 34 and/or the top dielectric layer 36 throughout the lifetime of the capacitor structure 30.

Figure 4:
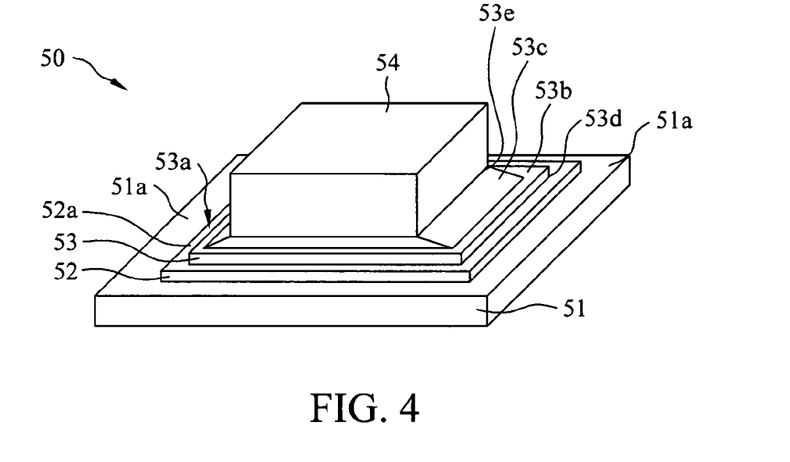
FIG. 4 is a perspective view of a pyramid-shaped capacitor according to an embodiment of the present invention.

It has been found, however, that further optimization of the capacitor configuration may be achieved by shaping a dielectric layer (or layers) so that it (or they, collectively) have a smaller area on top than on the bottom. FIG. 4 is a perspective view of a pyramid-shaped capacitor structure according to an embodiment of the present invention. Note that it resembles the structure of FIG. 3 except for the formation of the dielectric layers, and specifically of the top dielectric layer. In the embodiment of FIG. 4, a first conductive layer 51 is typically formed of polysilicon. A bottom dielectric layer 52 is formed on the first conductive layer 51, but is smaller in area, creating exposed surface 51a of conductive layer 51. Similarly, top dielectric layer 53 is formed on but smaller in area than bottom dielectric layer 52, creating exposed surface 52a.

Instead of being uniform in area, as with top dielectric layer 36, the area of top dielectric layer 53 of capacitor structure 50 is larger at the bottom 53d than at the top 53e. Approximately one-half way through its thickness, proceeding from bottom to top, top dielectric layer 53 begins gradually reducing in area such that the top 53c of dielectric layer 53 is smaller in area than the bottom 53d of top dielectric layer 53. The portion of top dielectric layer 53 in which this change in area occurs is herein referred to as a transition region. A second conductive layer 54 (of metal, for example) is formed on top conductive layer 53. Second conductive layer 54 is smaller than top dielectric layer 53, creating exposed surface 53a. In this embodiment, exposed surface 53a includes a flat portion 53b, which is roughly parallel to exposed surfaces 51a and 52a, and a sloped portion 53c. Sloped portion 53c of exposed surface 53a defines the transition region of top dielectric layer 53.

In the embodiment of FIG. 4, the transition region includes approximately one-half of the thickness of top dielectric layer 53, but it could also include more or less. The transition region may, in fact, start at any level within the transitioning layer (or layers). By the same token, the transition region may end before reaching the top of the layer. In another embodiment (not shown), there may be more than one transition region in a given layer, with different transition regions separated by a section of constant area. There is also no requirement (unless explicitly claimed) that the slope of the transition remain constant, or for that matter that it is the same on all sides of the capacitor structure.

Figure 5:
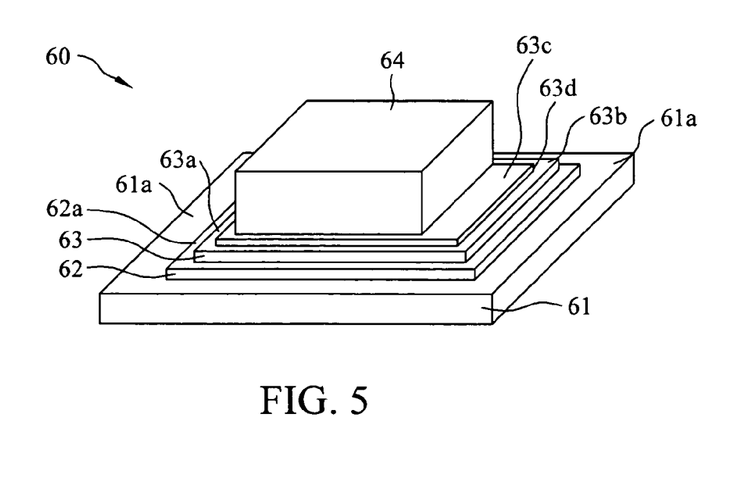
FIG. 5 is a perspective view of a pyramid-shaped capacitor according to another embodiment of the present invention.

The change occurring in the transition region of top dielectric layer 53 as illustrated in FIG. 4 is gradual. It may also be abrupt. FIG. 5 is a perspective view of a pyramid-shaped capacitor structure 60 according to another embodiment of the present invention. This configuration has some of the same features found in FIG. 4, and analogous reference numbers are used where appropriate. First conductive layer 61 and second conductive layer 64 are separated by top dielectric layer 63 and bottom dielectric layer 62. In the embodiment of FIG. 5, however, the top dielectric layer 63 forms an abrupt transition region at step 63d, which divides exposed surface 63a into a lower portion 63b and an upper portion 63c. In this embodiment, each portion of exposed surface 63a is parallel or substantially parallel with the plane surface of the wafer on which it is formed as well as with exposed surfaces 61a and 62a.

In an alternate embodiment (not shown), exposed surface 62a may have a small slope, with the outer perimeter of surface 62a being slightly lower than the outer perimeter of top dielectric layer 63. In yet another embodiment (also not shown), there may be more than one transition region. In each of these embodiments, however, the smallest area of the dielectric portion of capacitor 60 will be larger than that of the conductive portion 64 above it and the conductive portion 61 below.

Figure 6A:
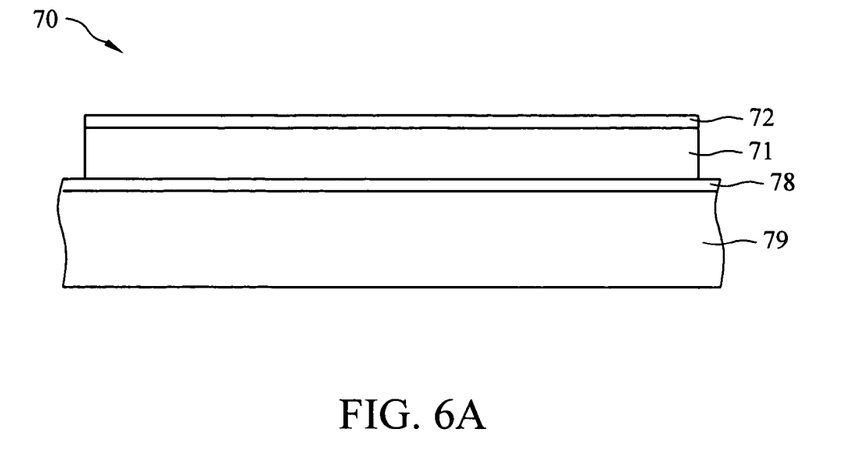
FIGS. 6A–6H are cross-sectional views illustrating the result of sequential process steps carried out in fabrication of a pyramid-shaped capacitor structure according an embodiment of the present invention illustrated in FIGS. 4 and 5.

In FIGS. 6A–6H, an illustrative process of fabricating the capacitor structure 70 is shown. Unless otherwise noted, the fabrication process may be carried out using conventional deposition and etching techniques known by those skilled in the art. As shown in FIG. 6A, capacitor structure 70 is, in this embodiment, formed on a substrate 79 from which it is separated by an insulating layer 78. The substrate 79 may, for example, be formed of a semiconductor material, a glass, bulk silicon, or may itself be a silicon on insulation structure (SOI) fabrication. Insulating layer 78 may, for example, be formed of a silicon oxide, a phosphorus-doped silicon oxide, a boron-doped silicon oxide, a low-k dielectric, a fluorine-doped silicate glass (FSG), or a carbon-doped silicon oxide. For convenience, the substrate 79 and the insulating layer 78 are shown in FIG. 6A but will be omitted from the FIGS. 6B through 8 that follow.

The fabrication of the capacitor structure 70 begins with providing a bottom conductive layer 71, which functions as a lower electrode for the capacitor. Bottom conductive layer 71 is typically formed of a polysilicon material, but may also be formed of a metal such as aluminum or copper, a metal nitride, or a combination of these (or other) materials. As further shown in FIG. 6A, a bottom dielectric layer 72, which is typically silicon oxide, is formed on the bottom conductive layer 71. Preferably, the bottom dielectric layer 72 has a thickness of typically about 250 angstroms.

Figure 6B:
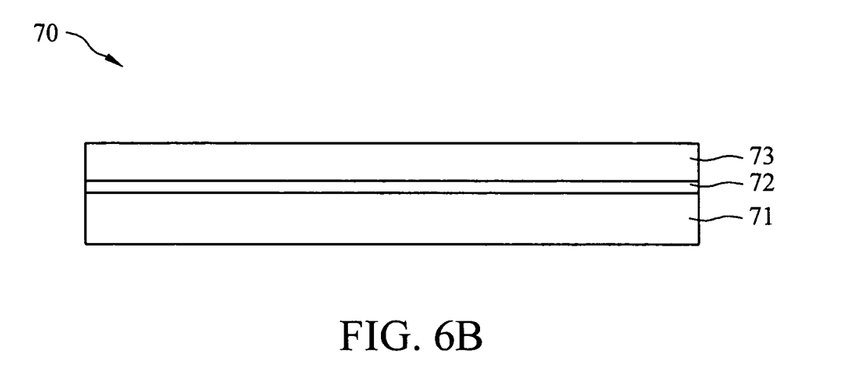

As shown in FIG. 6B, a top dielectric layer 73 may be formed on the bottom dielectric layer 72. The top dielectric layer 73 is typically silicon nitride and typically has a thickness of about 320 angstroms. Top dielectric layer 73 and bottom dielectric layer may now be formed according to an embodiment of the present invention and covered with a conductive layer to form a pyramidal-shaped capacitor. This process will now be explained in more detail.

Figure 6C:
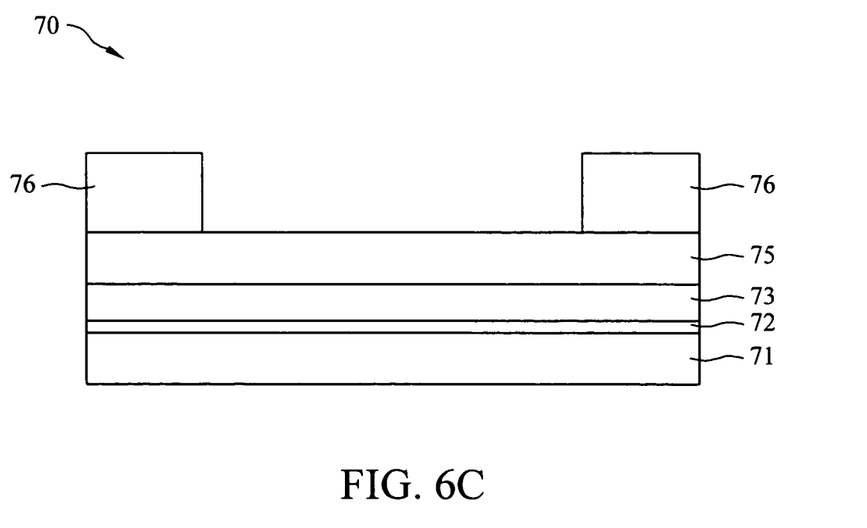
Figure 6D:
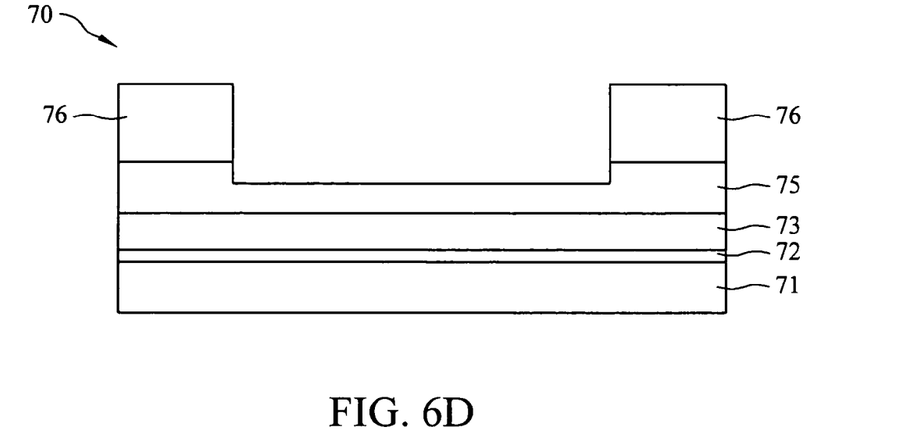

In the illustrated embodiment, the process continues with the deposition of a layer 75 of BPSG (borophosphosilicate glass), for example, by a plasma or vapor deposition process. A photoresist layer 76 is then deposited and patterned using conventional techniques. FIG. 6C illustrates this stage of the fabrication process. A dry etching is then performed, partially removing those portions of BPSG layer 75 that are not protected by the patterned resist layer 76 as illustrated in FIG. 6D.

Figure 6E:
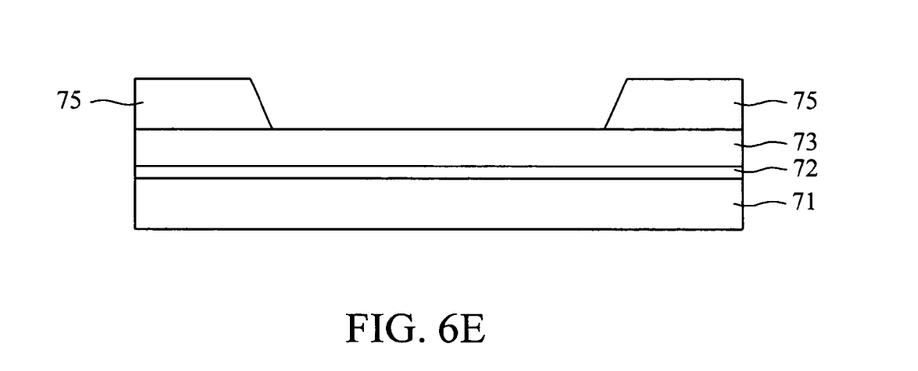

In accordance with the present invention, a descum procedure is next performed, followed by a wet rinse. A wet etching step then removes the remaining unwanted portions of the BPSG layer 75, as illustrated in FIG. 6E (which shows the fabrication process after the resist layer has been stripped).

Figure 6F:
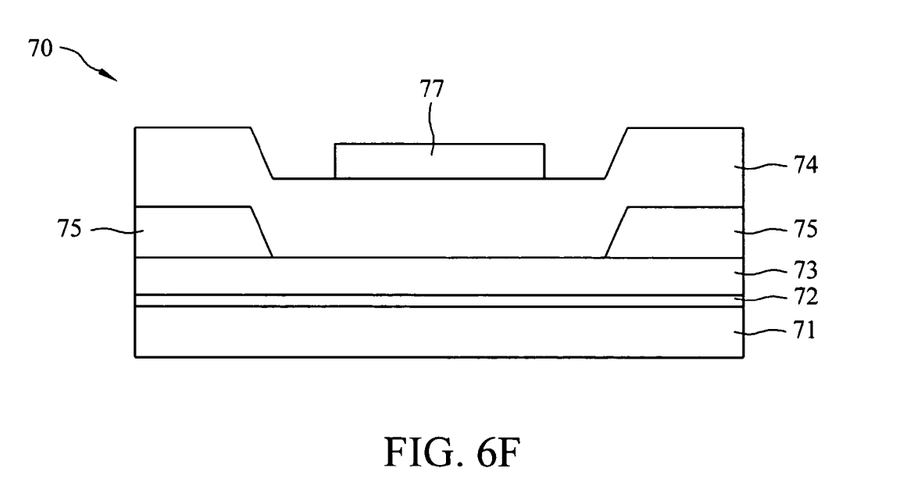

A top conductive layer 74, which functions as an upper electrode for the capacitor is next formed on the top dielectric layer 36, as shown in FIG. 6F. In the embodiment in which the capacitor structure 70 is a metal-insulator-polysilicon (MIP) capacitor, the top conductive layer 74 is a metal such as copper or aluminum. In the embodiment in which the capacitor structure 70 is a polysilicon-insulator-polysilicon (PIP) capacitor, the top conductive layer 74 is polysilicon. Top conductive layer 74 may also be formed of a metal nitride or a combination of these (or other) materials.

Figure 6G:
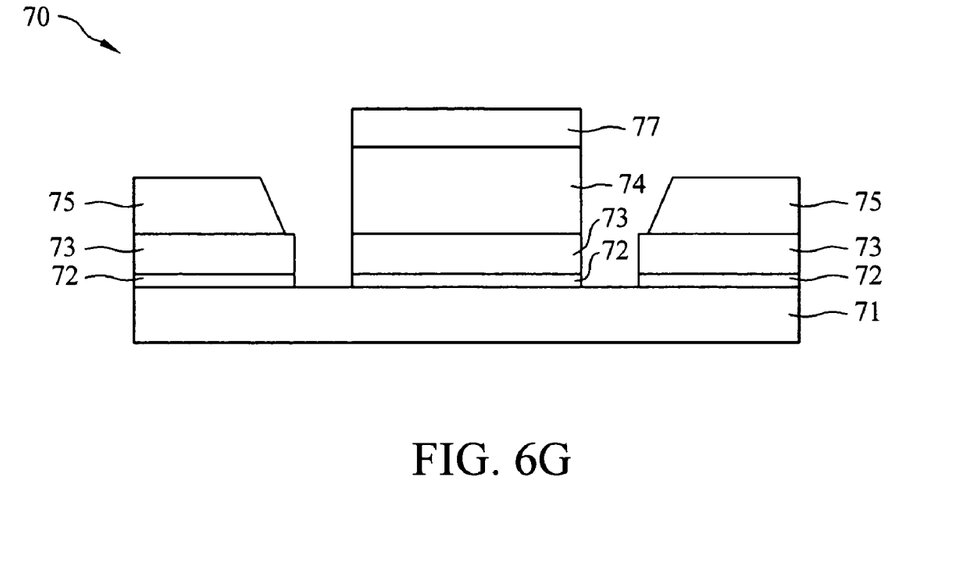

As also shown in FIG. 6F, a photoresist layer 77 is formed and patterned on the top conductive layer 74. The photoresist layer 77 defines a desired width of the conductive layer 74 at this stage of the fabrication. A metal dry-etching process is next carried out to etch the top conductive layer 74, as well as the top dielectric layer 73 and bottom dielectric layer 72 according to the dimensions defined by the patterned photoresist layer 77. This stage of fabrication is illustrated in FIG. 6G.

Figure 6H:
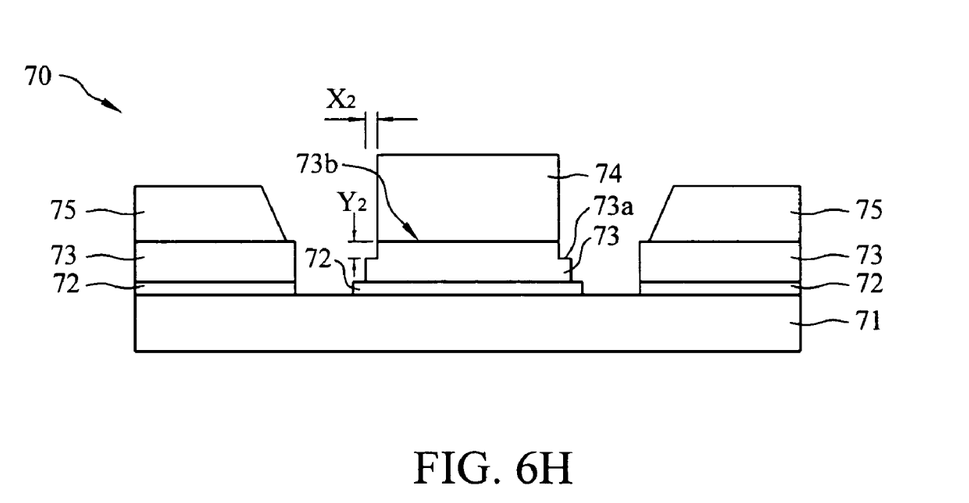

At this point in the process, a surface treatment, such as a wet rinse (for example, a de-ionized water rinse) or a diluted HF (hydrofluoric acid) dip (or both) is performed in order to remove residual polysilicon (or other) artifacts. A metal wet or dry etching step is next carried out to etch the sides of the top conductive layer 74 and uncover the exposed surface 73a of the top dielectric layer 73. As can be seen in FIG. 6H, exposed surface 73b is substantially horizontal in this embodiment, having a width $X_2$ and being a height $Y_2$ from the top 73b of top dielectric layer 73. The width $X_2$ of exposed surface 73a is typically at least about 0.1 μm (1000 angstroms). The height $Y_2$ is typically less than about 200 angstroms, preferably less than about 100 angstroms. An etch time of approximately one minute may be sufficient for this purpose. By use of a CAD bias for the wet etching process, the area obtained for the top conductive layer 74 can be selected depending on the desired capacitance for the capacitor structure 70. The photoresist structure 77 is then stripped away, resulting in the finished capacitor structure illustrated in FIG. 6H.

Figure 7:
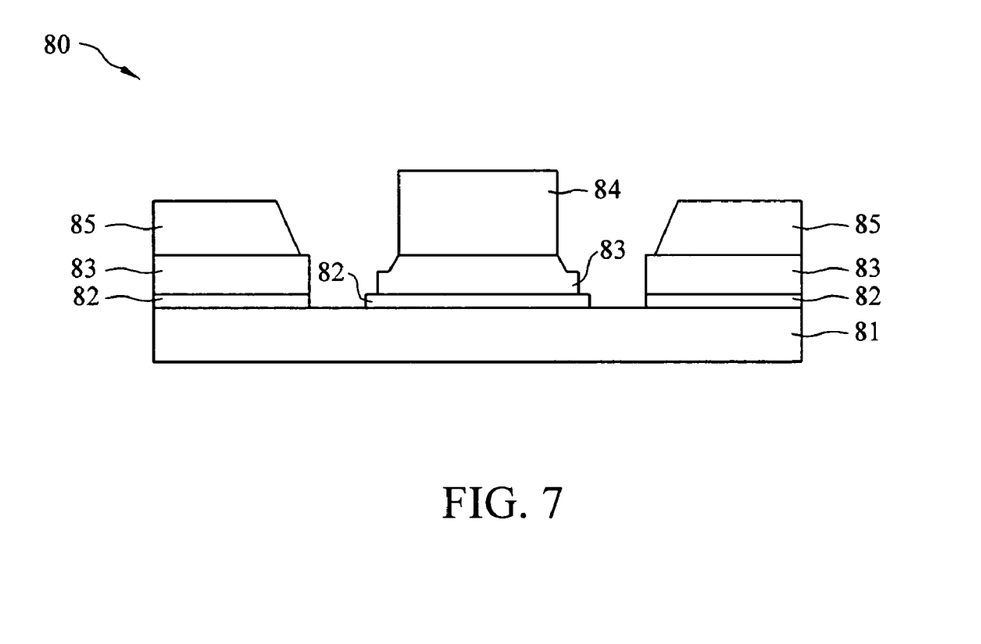
FIG. 7 is a cross-sectional view illustrating the result of a fabrication process according to another embodiment of the present invention.

As should be apparent from FIGS. 4 and 5, other embodiments are possible beside the capacitor structure depicted in FIG. 6H. FIG. 7 is a cross-sectional view illustrating the structure 80 resulting from a process analogous to that shown by FIGS. 6A–6G, but fabricating in the metal wet etch step a capacitor structure similar to that shown in FIG. 4. The various components are given analogous but not identical reference numbers. In the embodiment of FIG. 7, capacitor structure 80 is disposed in a recess formed by BPSG layer 85, which overlies a dielectric layer including top dielectric layer 83 and bottom dielectric layer 82. The entire structure is disposed on bottom conductive layer 81. In this embodiment, top dielectric layer 83 contains both an abrupt and a gradual transition in area. The gradual transition area may be said to define a plane that forms an angle with the plane of the area at the top and at the bottom of the transition region. In a preferred embodiment, this angle is less than 45°. In another embodiment (not shown) the transition is entirely gradual, rather than including the abrupt step shown in top dielectric layer 83 in FIG. 7. At the top of top conductive layer 83, it has substantially the same area as (the bottom of) top conductive layer 84.

Figure 8:
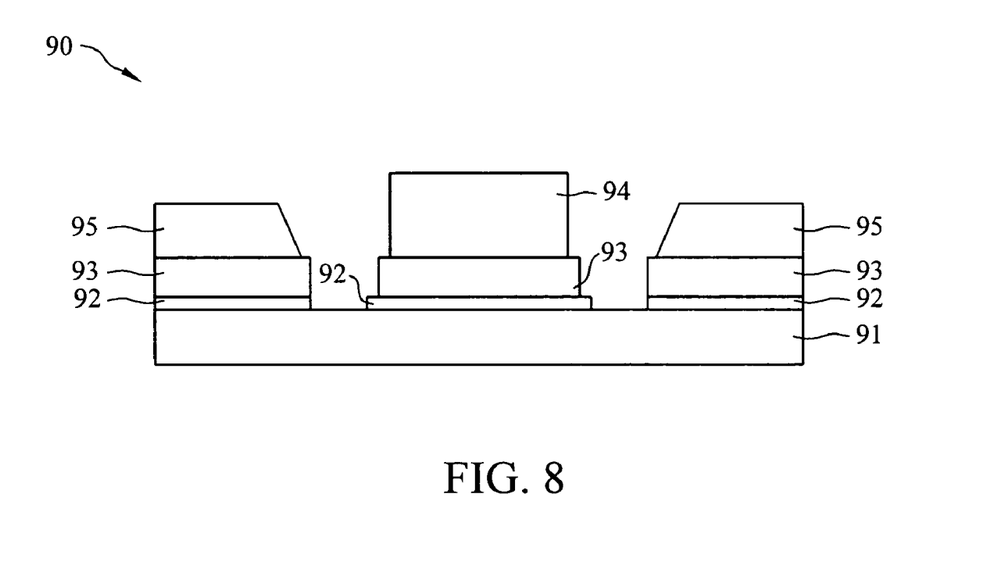
FIG. 8 is a cross-sectional view illustrating the result of a fabrication process according to another embodiment of the present invention.

Similarly, FIG. 8 is a cross-sectional view illustrating the structure 90 resulting from a process analogous to that shown by FIGS. 6A–6G, but fabricating the metal wet etch step a capacitor structure similar to that shown in FIG. 5. In the embodiment of FIG. 8, capacitor structure 90 is disposed in a recess formed by BPSG layer 95, which overlies a dielectric layer including top dielectric layer 93 and bottom dielectric layer 92. The entire structure is disposed on bottom conductive layer 91. In this embodiment, top dielectric layer 93 actually contains no transition region, but is less in area than top conductive portion 94 and greater in area that bottom dielectric layer 92.

These alternate structures are intended to be exemplary, however, and not limiting. Other variation is possible within the scope of the present invention.

While the preferred embodiments of the invention have been described above, it will be recognized and understood that various modifications can be made in the invention and the appended claims are intended to cover all such modifications which may fall within the spirit and scope of the invention.

The invention claimed is:

1. A capacitor structure comprising:
   a first conductive layer having a first area;
   at least one dielectric layer provided on said first conductive layer, said dielectric layer having a top area and a bottom area, said bottom area being less than the first area of the first conductive layer and said top area being less than said bottom area, defining a transition region where the change in area occurs, wherein approximately one-half of the at least one dielectric layer has an area substantially equal to the bottom area, and wherein a surface of the at least one dielectric layer forming a transition region defines a plane oriented at an angle of less than approximately 45° relative to the area; and
   a second conductive layer provided on said at least one dielectric layer, said second conductive layer having a second area less than said top area of said at least one dielectric layer.

2. The capacitor structure of claim 1, wherein said first conductive layer comprises polysilicon and said second conductive layer comprises metal.

3. The capacitor structure of claim 1, wherein said second conductive layer comprises polysilicon and said first conductive layer comprises polysilicon.

4. The capacitor structure of claim 1, wherein said at least one dielectric layer comprises a first dielectric layer provided on said first conductive layer and a second dielectric layer provided on said first dielectric layer.

5. The capacitor structure of claim 4, wherein said first dielectric layer comprises silicon oxide.

6. The capacitor structure of claim 4, wherein said second dielectric layer comprises silicon nitride.

7. The capacitor structure of claim 4, wherein said first dielectric layer comprises silicon oxide and has a thickness of about 100 to 800 angstroms and said second dielectric layer comprises silicon nitride and has a thickness of about 100 to 800 angstroms.

8. The capacitor structure of claim 1, wherein said at least one dielectric layer comprises a substantially-horizontal exposed surface disposed at a height of less than about 200 angstroms from the top of the at least one dielectric layer.

9. The capacitor structure of claim 1, wherein said at least one dielectric layer comprises a substantially-horizontal exposed surface disposed at a height of less than about 100 angstroms from the top of the at least one dielectric layer.

10. The capacitor structure of claim 1, wherein said at least one dielectric layer comprises an exposed surface having a width of at least about 0.1 µm.

11. A method of fabricating a capacitor structure, comprising:
   providing a first conductive layer having a first area;
   providing at least one dielectric layer on said first conductive layer;
   providing a second conductive layer on said at least one dielectric layer;
   patterning said second conductive layer and said at least one dielectric layer to a second area;
   etching said second conductive layer to a third area less than said second area; and
   etching said at least one dielectric layer to create a transition region, wherein said transition region includes a transition from a top area to a bottom area.

12. The method of claim 11, further comprising a surface treatment after the patterning step and before the etching steps.

13. The method of claim 11, wherein the transition region is characterized by an abrupt transition.

14. The method of claim 11, wherein the transition region is characterized by a gradual transition.

* * * * *